United States Patent [19]

LaRosa

[11] Patent Number: 5,485,036
[45] Date of Patent: Jan. 16, 1996

[54] LOCAL GROUND PLANE FOR HIGH FREQUENCY CIRCUITS

[75] Inventor: Richard LaRosa, S. Hempstead, N.Y.

[73] Assignee: Hazeltine Corporation, Greenlawn, N.Y.

[21] Appl. No.: 285,571

[22] Filed: Aug. 3, 1994

[51] Int. Cl.$^6$ .......................... H01L 39/02; H01L 23/12; H01L 23/14
[52] U.S. Cl. .......................................... 257/691; 257/728
[58] Field of Search .................................. 257/691, 728, 257/664

[56] References Cited

U.S. PATENT DOCUMENTS 3,784,883  1/1974  Duncan et al. ........................ 257/728
5,138,436  8/1992  Koepf ..................................... 257/728

*Primary Examiner*—Sara W. Crane
*Assistant Examiner*—S. V. Clark
*Attorney, Agent, or Firm*—E. A. Onders; W. B. Ritchie

[57] ABSTRACT

A local R.F. ground plane for high frequency active device. The R.F. grounded terminal of each active device is connected directly to its local R.F. ground plane. In the case of a transistor, there are common emitter, common base, or common collector circuits. The common electrode or terminal is connected directly to the local R.F. ground plane. In the case of a FET, the common electrode can be the source, gate or drain. In the case of a thermionic vacuum tube, the common electrode can be the cathode, grid or plate. In the case of a vacuum microelectronic device, the names are still evolving. The local R.F. ground is bypassed to the case of the package near the local R.F. input and/or output connections. This design permits double bond wires from the emitter to the local R.F. ground plane and eliminates parasitic oscillations where the potential oscillation frequency of the active device being protected is at least twice as great as the operating frequency of the package.

8 Claims, 2 Drawing Sheets

LOCAL GROUND PLANE FOR HIGH FREQUENCY CIRCUITS

BACKGROUND OF THE INVENTION

1. Field of the Invention

The invention relates to stabilizing the active devices of a circuit, e.g., transistors, FETs, etc., for use in thick film packages where the active devices have potential oscillation frequencies that are substantially higher than the operational frequencies of circuits that the active devices are being used in.

2. Description of the Related Art

While the use of thick film technology offers significant size and durability advantages, this technology still presents limitations when it comes to grounding circuit components. Among the most troublesome is the difficulty in mounting an active device on the ceramic substrate where a short length connection to the main D.C. (direct current) ground plane is required. A typical active device such as a bipolar transistor or FET (field effect transistor) utilizes the biasing method shown in FIG. 1. This divider uses $R_B$ and $R_S$ to set the base (gate) voltage. Emitter 12 is connected to emitter (source) bias $R_E$. Resistor $R_E$ stabilizes transistor 11 current. Current I adjusts itself so that emitter 12 is almost at:

$$V_{cc} \frac{R_S}{R_B + R_S}$$

Therefore, current I is as follows:

$$I = V_{cc} \frac{R_S}{R_B + R_S} \frac{1}{R_E}$$

In this configuration, the current is very stable even though certain parameters of the active device, transistor 11, change appreciably with temperature.

A bypass capacitor $C_E$ is required to prevent R.F. (radio frequency) voltage from appearing across $R_E$. There must be a short, direct path from $C_E$ to ground. The position of the main ground plane is customarily on the underside of a 0.025 inch thick alumina ($Al_2O_3$) substrate. Plane A in the diagram represents the underside metallization of the substrate.

Also, as is common in such situations, the active devices are capable of oscillating at frequencies substantially greater than the operational frequency of the circuit.

SUMMARY OF THE INVENTION

It is an object of the invention to provide a local ground plane apparatus that eliminates the need for drilling holes immediately adjacent to the active devices.

It is another object of the invention to provide a local ground plane apparatus that provides a low inductance path to ground for active devices being used in high frequency circuits.

It is still another object of the invention to provide a local ground plane apparatus for circuits having an active device with a potential frequency of oscillation that is at least twice the operational frequency of the circuit in which the active device is included.

Another object of the invention is to provide a local ground plane apparatus that is sized in accordance with the active device and its associated electronic components such that the local ground plane is between the active device with its associated electronic components and the D.C. ground plane.

It is still another object of the invention to enable the use of short, direct bonds from the emitter of the transistor.

Another object of the invention is to enable the bias network that is connected to the active device to be grounded to the main ground plane at a distance from the active device.

Finally, it is an object of the invention to stabilize the active device to eliminate parasitic oscillations.

The invention is an apparatus for a planar circuit having a circuit surface, a plurality of electronic components attached to said circuit surface to form a circuit, and a main ground plane separated therefrom by an insulating substrate, with said main ground plane serving as D.C. ground for said circuit. At least one active device with a bias network is provided. Also, a R.F. bypass capacitance is connected to said active device. The active device has a potential oscillating frequency that is substantially greater than the operating frequency of said planar circuit. The active device has a plurality of associated electronic component elements. The active device and its associated component elements are connected to the circuit surface. A planar local R.F. ground plane is provided. The planar local R.F. ground plane is connected between the active device and the bias network of said active device. The planar local R.F. ground plane is also positioned between the associated component elements of the active device and the main ground plane. The local ground plane has a pre-determined surface geometry that corresponds to the active device and its associated electronic components. A low inductance path is provided to the local ground plane from the active device which serves to prevent parasitic oscillations in the planar circuit.

As an alternative embodiment, an intermediate land and an attached insulating substrate is provided. The intermediate land and its attached substrate is positioned between the local ground plane and the active device. The active device is first connected to the intermediate land by at least one bond and then the intermediate land is connected to the local ground plane with a plurality of bonds to minimize inductance. The use of the intermediate land enables the use of shorter bond wires than would be obtained by directly connecting the active device to the local ground plane.

DETAILED DESCRIPTION OF THE INVENTION

Figure 1:
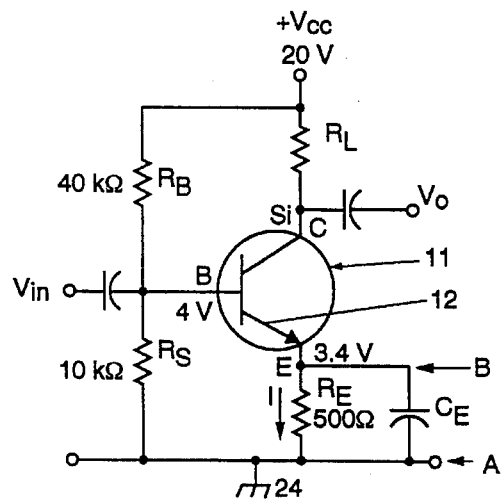
FIG. 1 is a schematic showing the prior art preferred method self-biasing active devices such as bipolar transistors.
Figure 2:
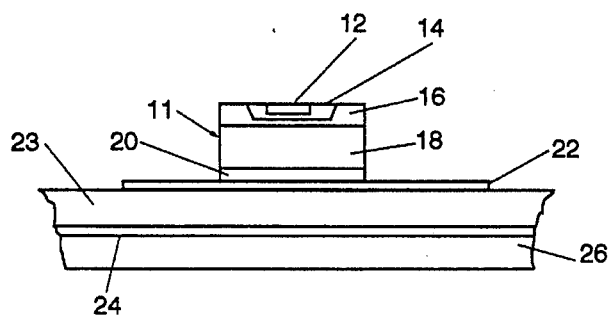
FIG. 2. is a side cross-sectional view of an active device connected on a typical thick film substrate.

FIG. 2. is a side cross-sectional view of an active device, transistor 11, connected on a typical thick film substrate, ceramic substrate 23. Typically, transistor 11 has a potential oscillation frequency of approximately 6,000 MHz while the operating frequency of the circuit would be in the range of 500 MHz. The capacitors that are suitable for $C_E$ (shown in FIG. 1) which meet the requirements for the 500 MHz operating frequency are not of sufficiently low stray inductance to prevent oscillation at 6,000 MHz which would result in unwanted parasitic oscillations.

Transistor 11 comprises emitter 12, base 14, epitaxial layer 16, collector 18 and back metallization 20 which is attached to collector mounting land 22. Land 22 is then attached to ceramic substrate 23. A metallized layer is mounted beneath substrate 23 which serves as main ground plane 24. Package floor 26 completes the apparatus. In order to eliminate parasitic oscillations in the prior art design, it would be necessary to make a hole, i.e., a "via", in substrate 23 very near emitter 12 and use a very low stray inductance capacitor (not shown) with very short paths to ground plane 24. This would be extremely difficult and expensive to accomplish.

Figure 3:
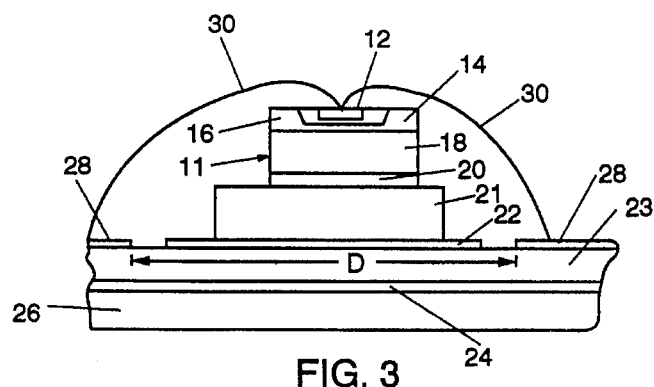
FIG. 3 is a side cross-sectional view of an active device connected on a typical thick film substrate using a local ground plane in accordance with the invention.

FIG. 3 is a side cross-sectional view of transistor 11 connected to a typical thick film substrate in accordance with the invention. As above, transistor 11 is connected to substrate 23 via back metalization 20. In this view, transistor 11 is shown with heat sink 21. Heat sink 21 is preferably molybdenum, however; other materials that are well known in the art for such use can also be utilized. Immediately adjacent to land 22 is local R.F. ground plane 28. Distance D is selected to minimize the opening with plane 28 to accommodate transistor 11. In this manner, the remaining electronic components associated with transistor 11 will be shielded from ground plane 24 via local R.F. ground plane 28. Therefore, all the associated electronic component parts (shown in FIG. 5), whether or not connected to local R.F. ground plane 28 are positioned so that local R.F. ground plane is between the components and main ground plane 24. Local R.F. ground plane 28 may completely shield all elements of the local circuit from the main ground plane, or there may, for convenience, be small windows in the local R.F. ground plane to accommodate small circuit lands which act as connection points or mounting pads for certain elements of the local circuit. The capacitance of each of these lands to the main ground plane must be evaluated to determine whether the capacitance is large enough to cause a potential high frequency oscillation problem.

Emitter bonds 30 can be short because bonds 30 need only connect to local R.F. ground plane 28. Also, no holes, that is, vias, need to be drilled through substrate 23 at this position. The biasing network (not shown) for transistor 11 is connected to local ground plane 28 and main ground plane 24 at a convenient distance from transistor 11.

Each active device in the circuit should have its individual local R.F. ground plane connected directly to the emitter if a transistor is in a common emitter circuit. A transistor can be used in a common base circuit or a common collector circuit, in which case, the local R.F. ground plane would be connected to the base or collector, respectively. Moreover, the active element might be a field effect transistor (FET) in a common source, common gate or common drain circuit. A thermionic vacuum tube could be used in a common cathode, grid or plate configuration. Similar choices exist for vacuum microelectronic devices. The local R.F. ground plane is connected to the common terminal of the active device. In this application, the terms "emitter" and "transistor" should be understand to be examples of the invention rather than specific restrictions.

The local R.F. ground plane is D.C. isolated from the main ground plane and metal case and is bypassed to the main ground plane near R.F. input or output connections to the local circuit. In this manner, double bond wires from the emitter to the local R.F. ground plane are possible and parasitic oscillations caused by impedance between the emitter and ground are eliminated.

While care must be exercised if $C_E$ is split into two or more component parts in order to avoid circulating currents in the ground paths, this problem is manageable and far easier to solve than the problem associated with 6000 MHz oscillations in the absence of the invention.

Figure 4:
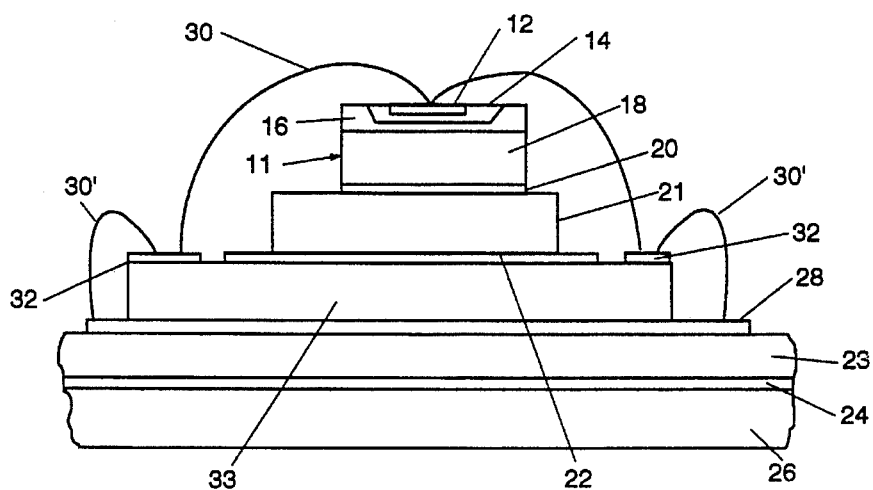
FIG. 4 is an alternative embodiment of the invention showing the use of an intermediate land.

FIG. 4 is an alternative embodiment of the invention showing the use of intermediate substrate 33 and intermediate land 32. This embodiment is used to accommodate the physical peculiarities of certain circuit elements. The intermediate land 32 allows the use of shorter bond wires 30 than would otherwise be necessary to connect emitter 12 directly to local R.F. ground plane 28. Intermediate land 32 is then bonded to local R.F. ground plane 28 via bonds 30'. Intermediate land 32 has a conductive surface supported on insulating surface 33 using techniques well known in the thick film arts.

Figure 5:
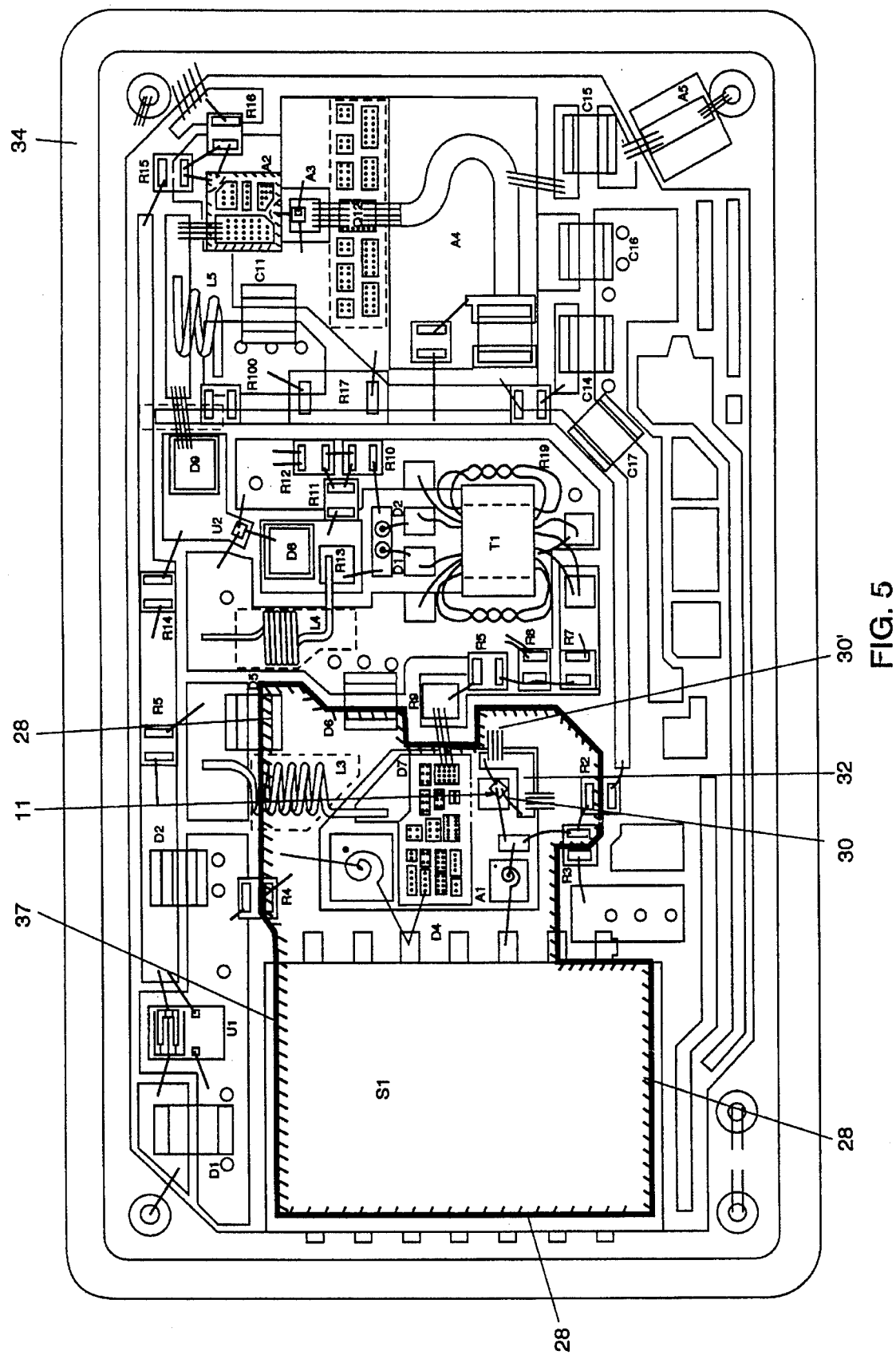
FIG. 5 is a top view of a typical thick film package with the local ground plane in position under an active device and its associated electronic components.

FIG. 5 is a top view of a typical thick film package 34. The extent of local R.F. ground plane 28 is shown by dotted line 37 which D.C. isolates all components positioned on top of ground plane 28 from main ground plane 24 (shown in FIG. 4) of package 34. As noted, transistor 11 is first bonded to intermediate land 32 by two bonds and then intermediate land 32 is bonded to local R.F. ground plane 28 via two sets of four bond wires 30'.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An apparatus for a planar circuit, said planar circuit being defined as having a circuit surface, a plurality of electronic components attached to said circuit surface, and having a main ground plane separated therefrom said circuit surface by an insulating substrate, with said main ground plane serving as DC ground for said planar circuit, said apparatus comprising:

at least one of said plurality of electronic components of said planar circuit being an active device, said active device having a bias network, said bias network having a R.F. bypass capacitance, said active device having a potential oscillating frequency that is substantially greater than the operating frequency of said planar circuit, said active device and said bias network attached to said circuit surface;

a local R.F. ground plane, connected between said active device and said bias network of said active device, and positioned between said bias network of said active device and the main ground plane with said local ground plane having a pre-determined surface geometry corresponding to said active device and said bias network wherein said active device has a low inductance path to said local ground plane thereby preventing parasitic oscillations in said planar circuit.

2. The apparatus of claim 1 further comprising an intermediate land and an attached insulating substrate, said intermediate land and its attached substrate connected between said local ground plane and said active device and wherein said active device is first connected to said intermediate land by at least one bond and then said intermediate land is connected to said local ground plane, thereby permitting the use of shorter bond wires than would be obtained by directly connecting said active device to said local ground plane.

3. The apparatus of claim 1 where said active device is connected to said apparatus using a conductive land and said local ground plane further comprising an opening corresponding to the geometry of said conductive land.

4. The apparatus of claim 1 where said active device has an oscillation frequency that is at least twice that of the operating frequency of said planar circuit.

5. The apparatus of claim 1 where said capacitance that is connected between said local R.F. ground plane and said main ground plane is selected in accordance with the operating frequency of said planar circuit.

6. The apparatus of claim 1 wherein said local ground plane has at least one window to accommodate a land.

7. The apparatus of claim 1 wherein at least another one of said plurality of electronic components is associated with said active element and is shielded from said main ground plane by said local R.F. ground plane.

8. The apparatus of claim 1 wherein at least another one of said plurality of said electronic components is associated with said active element, is not connected to said local ground plane, and is shielded from said main ground plane by said local R.F. ground plane.

\* \* \* \* \*